United States Patent
Song et al.

(10) Patent No.: US 7,462,877 B2
(45) Date of Patent: Dec. 9, 2008

(54) NITRIDE-BASED LIGHT EMITTING DEVICE, AND METHOD OF MANUFACTURING THE SAME

(75) Inventors: June-o Song, Gwangju-si (KR); Tae-yeon Seong, Gwangju-si (KR)

(73) Assignees: Samsung Electronics Co., Ltd., Suwon-Si, Gyeonggi-Do (KR); Gwangju Institute of Science and Technology, Buk-Gu, Gwangju-Si (KR)

( * ) Notice: Subject to any disclaimer, the term of this patent is extended or adjusted under 35 U.S.C. 154(b) by 0 days.

(21) Appl. No.: 10/891,014

(22) Filed: Jul. 15, 2004

(65) Prior Publication Data
US 2005/0045907 A1 Mar. 3, 2005

(30) Foreign Application Priority Data
Aug. 25, 2003 (KR) .................. 10-2003-0058841

(51) Int. Cl.
*H01L 33/00* (2006.01)
(52) U.S. Cl. .................. 257/98; 257/103; 257/744; 257/745; 257/E33.005; 257/E33.028; 257/E33.064
(58) Field of Classification Search .................. 257/98, 257/103, 744, 745; 438/27
See application file for complete search history.

(56) References Cited

U.S. PATENT DOCUMENTS

| | | | | |
|---|---|---|---|---|
| 5,990,500 A * | 11/1999 | Okazaki | .................. | 257/99 |
| 6,693,352 B1 * | 2/2004 | Huang et al. | .................. | 257/743 |
| 6,949,773 B2 * | 9/2005 | Shin | .................. | 257/99 |
| 6,969,874 B1 * | 11/2005 | Gee et al. | .................. | 257/98 |
| 6,989,598 B2 * | 1/2006 | Song et al. | .................. | 257/743 |
| 7,180,094 B2 * | 2/2007 | Seong et al. | .................. | 257/59 |
| 2002/0014630 A1 * | 2/2002 | Okazai et al. | .................. | 257/79 |
| 2002/0036286 A1 * | 3/2002 | Ho et al. | .................. | 257/11 |
| 2002/0190260 A1 | 12/2002 | Shen et al. | | |
| 2003/0160259 A1 * | 8/2003 | Uemura | .................. | 257/99 |
| 2005/0056857 A1 * | 3/2005 | Okazaki et al. | .................. | 257/98 |
| 2005/0072968 A1 * | 4/2005 | Tsai et al. | .................. | 257/10 |
| 2005/0087753 A1 * | 4/2005 | D'Evelyn et al. | .................. | 257/98 |
| 2005/0133799 A1 * | 6/2005 | Uemura et al. | .................. | 257/79 |

FOREIGN PATENT DOCUMENTS

| | | |
|---|---|---|
| DE | 199 21 987 A1 | 11/1999 |
| EP | 1 168 460 A2 | 1/2002 |
| EP | 1 294 028 A1 | 3/2003 |

(Continued)

OTHER PUBLICATIONS

Korean Office Action dated Jul. 25, 2005.

(Continued)

*Primary Examiner*—Ahmed Sefer
(74) *Attorney, Agent, or Firm*—Buchanan Ingersoll & Rooney PC

(57) ABSTRACT

A nitride-based light emitting device having a light emitting layer between an N-type clad layer and a P-type clad layer is provided. The light emitting device including: a reflective layer which reflects light emitting from the light emitting layer; and at least one metal layer which is formed between the reflective layer and the P-type clad layer.

12 Claims, 7 Drawing Sheets

FOREIGN PATENT DOCUMENTS

| | | | |
|---|---|---|---|
| JP | 10-135515 | * | 5/1998 |
| JP | 2002-26392 | | 1/2002 |
| JP | 2002-246648 | * | 8/2002 |
| KR | 1999-0088218 | | 12/1999 |
| WO | 01/47038 A1 | | 6/2001 |

OTHER PUBLICATIONS

European Search Report (in English) issued by the EPO in corresponding European Patent Application No. 04 25 4402.3 on Nov. 14, 2006, The Hague, The Netherlands.

* cited by examiner

NITRIDE-BASED LIGHT EMITTING DEVICE, AND METHOD OF MANUFACTURING THE SAME

BACKGROUND OF THE INVENTION

This application claims the priority of Korean Patent Application No. 2003-58841, filed on Aug. 25, 2003, in the Korean Intellectual Property Office, the disclosure of which is incorporated herein in its entirety by reference.

1. Field of the Invention

The present invention relates to a nitride-based light emitting device and a method of manufacturing the same, and more particularly, to a nitride-based light emitting device having an Ohmic contact structure for increasing a quantum efficiency, and a method of manufacturing the same.

2. Description of the Related Art

In order to embody a light emitting device such as a light emitting diode or a laser diode by using a nitride-based compound semiconductor, for example, a gallium nitride (GaN) semiconductor, Ohmic contact structure between a semiconductor and an electrode is of much importance. A gallium nitride-based light emitting device is formed on an insulating sapphire ($Al_2O_3$) substrate.

The gallium nitride-based light emitting device is classified into Top-Emitting Light Emitting Diodes (TLEDs) and Flip-Chip Light Emitting Diodes (FCLEDs).

The top-emitting light emitting diode allows light to emit through an Ohmic electrode layer that is in contact with a P-type clad layer, and provides a low electric conductivity of the P-type clad to allow smooth current injection through the Ohmic electrode layer with transparency and low resistance.

The top-emitting light emitting diode is generally employing a structure of a nickel (Ni) layer and a gold (Au) layer sequential layered on the P-type clad layer.

The nickel layer is known in the art to form a semi-transparent Ohmic contact layer that is annealed in oxygen (O2) atmosphere to have a relative contact resistance of about $10^{-3}$-$10^{-4}$ $\Omega cm^2$.

When the semi-transparent Ohmic contact layer is annealed at about 500-600° C. in the oxygen atmosphere, the semi-transparent Ohmic contact layer provide a low relative contact resistance between the gold (Au) layer and a lower layer portion where the nickel oxide (NiO) is island-shaped as a P-type semiconductor oxide between the gallium nitride that forms the P-type clad layer and the nickel layer that is used as the Ohmic contact layer. Accordingly, a Schottky Barrier Height (SBH) is reduced, thereby facilitate to supply holes as a majority carrier in the vicinity of a surface of the P-type clad layer. As a result, an effective carrier concentration is increased in the vicinity of the surface of the P-type clad layer.

Further, after the nickel layer and the gold layer are formed on the P-type clad layer, a reactivation process using the annealing is performed to remove a Mg—H compound to thereby increase a concentration of Magnesium dopants at a surface of the gallium nitride. As a result, the effective carrier concentration of above $10^{19}$ is obtained at the surface of the P-type clad layer. Therefore, tunneling conduction is generated between the P-type clad layer and the Ohmic electrode layer that contains nickel oxide to provide an Ohmic conduction characteristic.

However, since the top-emitting light emitting diode using a semi-transparent electrode film formed of nickel/gold has a low optic efficiency, it is difficult to embody a large-capacity and high-luminance light emitting device.

In order to embody the large-capacity and high-luminance light emitting device, a flip-chip light emitting device using silver (Ag) or aluminum (Al) that is noticed as a high reflective material is being recently required for development.

However, silver or aluminum can temporarily provide a high light-emitting efficiency due to its high reflection efficiency, but there is a drawback in that a device life is short since it is difficult to form an Ohmic contact with a lower resistance due to a small work function, and a stable device reliability is not provided since the adhesiveness with the gallium nitride is poor.

In order to solve the above drawback, an Ohmic contact layer providing the high reflectivity despite the low relative contact resistance is being vigorously studied for development.

U.S. Patent Publication No.: 2002-0190260A1 discloses a structure with nickel/silver sequential layered on the P-type clad layer, but has a drawback in that contact resistance is high, and adhesiveness is low at the time of annealing.

SUMMARY OF THE INVENTION

The present invention provides a nitride-based light emitting device having an electrode structure for providing a low resistance characteristic and a high reflectivity, and a method of manufacturing the same.

According to an aspect of the present invention, there is provided a nitride-based light emitting device having a light emitting layer between an N-type clad layer and a P-type clad layer, the light emitting device including: a reflective layer which reflects light emitting from the light emitting layer; and at least one metal layer which is formed between the reflective layer and the P-type clad layer.

The metal layer comprises any one selected from the first metal group consisting of zinc, indium and tin.

The metal layer is the addition of any one of selected from the second metal group consisting of nickel, cobalt, copper, palladium, platinum, ruthenium, rhodium, iridium, tantalum, rhenium, tungsten, and a lanthanum-based metal, to any one selected from the first metal group.

An addition ratio of the second metal group to the first metal group is 0.1 to 51 atomic percentages.

The reflective layer is formed of silver or rhodium.

The metal layer includes: a first metal layer formed on the P-type clad layer; and a second metal layer formed between the first metal layer and the reflective layer, the first metal layer is formed of any one of selected from the second metal group consisting of nickel, cobalt, copper, palladium, platinum, ruthenium, rhodium, iridium, tantalum, rhenium, tungsten, and a lanthanum-based metal, and the second metal layer is formed of any one of selected from the first metal group consisting of zinc, indium and tin.

The second metal layer is formed by addition of any one selected from the second metal group to any one selected from the first metal group.

The metal layer and the reflective layer have a thickness of 0.1 nm to 1 µm.

The N-type clad layer is formed on a substrate that is formed of light transmission material.

In another aspect of the present invention, there is provided a method of manufacturing a nitride-based light emitting device having a light emitting layer between an N-type clad layer and a P-type clad layer, the method including: forming at least one metal layer on the P-type clad layer of a light emitting structure with the N-type clad layer, the light emitting layer and the P-type clad layer sequentially layered on a substrate; forming a reflective layer on the metal layer; and annealing the resultant layer structure having the reflective layer.

The annealing may be performed at 20° C. to 700° C., and the annealing may be performed in gas atmosphere containing at least one of nitrogen, argon, helium, oxygen, hydrogen, and air within a reactor in which the layer structure is installed.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
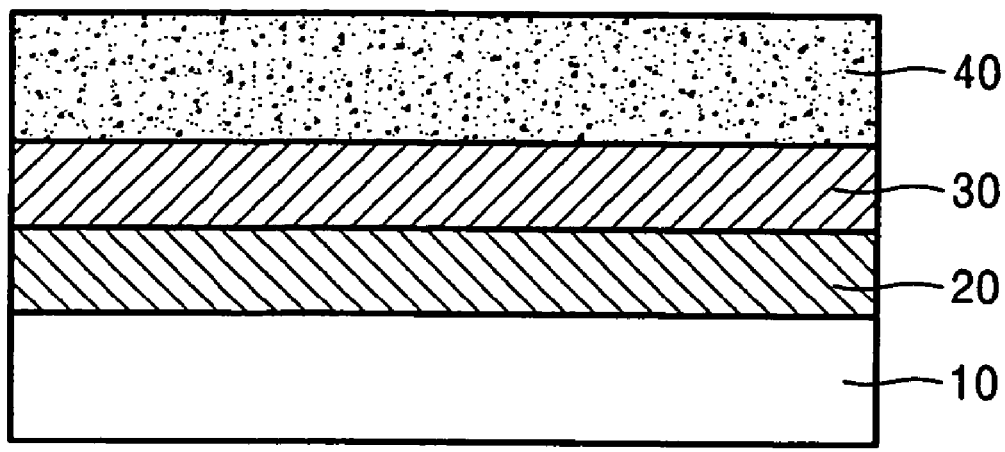
FIG. 1 is a sectional view illustrating a P-type electrode structure according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present.

FIG. 1 is a sectional view illustrating a P-type electrode structure with a metal layer and a reflective layer each having a different thickness according to an embodiment of the present invention.

Referring to FIG. 1, the P-type electrode structure includes a metal layer 30 and a reflective layer 40.

In FIG. 1, the P-type electrode structure includes a III-group nitride-based P-type clad layer 20 formed on a substrate 10; and the metal layer 30 and the reflective layer 40 sequentially layered on the P-type clad layer 20. A characteristic experiment is made between the P-type clad layer 20 and the P-type electrode structure 30 and 40. The P-type clad layer 20 is required to have an improved Ohmic characteristic among an N-type clad layer and the P-type clad layer that face with each other centering on a light emitting layer of the III-group nitride-based light emitting device.

The P-type clad layer 20 uses III-group nitride compound with P-type dopants being doped.

Here, the III-group nitride compound is expressed in a general formula $Al_xIn_yGa_zN$ ($0 \leq x \leq 1$, $0 \leq y \leq 1$, $0 \leq z \leq 1$, $0 \leq x+y+z \leq 1$).

Further, the P-type dopant can use Mg, Zn, Ca, Sr, Ba and the like.

The metal layer 30 can employ metal or alloy that has a good reaction with the P-type clad layer 20.

The metal layer 30 may employ metal, which can increase an effective carrier concentration of the P-type clad layer 20 and has a good primary reaction with a component, excepting for nitride, among the III-group nitride compound of the P-type clad layer 20. For example, when the clad layer 20 employs a GaN-based compound, the metal layer 30 employs metal having a primary reaction with gallium (Ga) rather than nitride (N).

As one example, the P-type clad layer 20 with a main ingredient being gallium nitride (GaN) has gallium vacancy that is formed on a surface thereof by the reaction of gallium (Ga) of the P-type clad layer 20 with the metal layer 30. The gallium vacancy of the P-type clad layer 20 functions as the P-type dopants to increase the effective carrier concentration on the surface of the P-type clad layer 20 by the reaction of the P-type clad layer 20 and the metal layer 30.

The metal layer 30 satisfying the above condition is formed of any one selected from the first metal group consisting of Zinc (Zn), Indium (In) and Tin (Sn).

Otherwise, the metal layer 30 can be formed of alloy that has any one main ingredient selected from the first metal group and any one additional ingredient selected from a second metal group.

The second metal group includes Nickel (Ni), Cobalt (Co), Copper (Cu), Palladium (Pd), Platinum (Pt), Ruthenium (Ru), Rhodium (Rh), Iridium (Ir), Tantalum (Ta), Rhenium (Re), Tungsten (W), and Lanthanum (La).

An addition ratio of the second metal group to the first metal group may be within 0.1 to 51 atomic percentages.

The reflective layer 40 is an uppermost layer in the P-type electrode structure. The reflective layer 40 employs material suppressing a surface degradation, being stable against oxidation, having a non-varied characteristic, and having a high reflectivity power, at 300-600° C., which is a general temperature, in a process of manufacturing a flip-chip light emitting device.

The reflective layer 40 may be formed of Silver (Ag) or Rhodium (Rh) that satisfies the above condition.

Furthermore, the metal layer 30 and the reflective layer 40 may have a thickness of 0.1 nm to 10 μm.

The metal layer 30 and the reflective layer 40 are firmed using various well-known methods, for example, using Physical Vapor Deposition (PVD), Chemical Vapor Deposition (CVD), Plasma Laser Deposition (PLD), a dual-type thermal evaporator, sputtering and the like.

The metal layer 30 and the reflective layer 40 are generally deposited at a temperature of 20-1500° C. in a reactor with a pressure of atmospheric pressure to about 10-12 torr.

After that, the metal layer 30 and the reflective layer 40 are annealed at 20-700° C. for one second to 10 hours in a vacuum or gas atmosphere.

When the metal layer 30 and the reflective layer 40 are annealed in a reactor, at least one of nitrogen, argon, helium, oxygen, hydrogen and air is introduced into the reactor.

Hereinafter, a method of manufacturing the P-type electrode structure according an embodiment of the present invention is described. However, the present invention is not limited to the method exemplified through the embodiment.

First, a structure with the substrate 10 and the P-type clad layer 20, which is formed on the substrate and has the gallium nitride as the main ingredient, is surface-cleaned at 60° C. for five minutes in an ultrasonic bath using trichloroethylene, acetone, methanol, and distilled water, respectively, and then is hard-baked at 100° C. for ten minutes for dehydration.

After that, the resultant structure is spin-coated at 400-500 rpm to form a photo-resist on the P-type clad layer 20. Next, the resultant is soft-baked for 15 minutes at 85° C., and a mask and a pattern are aligned to develop a mask pattern. After that, the developed resultant is exposed for 15 seconds to ultraviolet (UV) with an intensity of 22.8 mW, and then dipped for about 25 seconds into solution with a developing agent and the distilled water being mixed at a ratio of 1:4, for development.

Next, the developed resultant is dipped into BOE solution for five minutes so as to remove a pollution layer. The zinc-nickel alloy is deposited in an electron-beam evaporator to form the metal layer 30 on the P-type clad layer 20 at a thickness of 10 nm, and then silver is deposited on the metal layer 30 in the electron-beam evaporator to form the reflective layer 40 at a thickness of 10 nm. After that, the resultant is processed in a lift-off process using acetone, and then is annealed using a Rapid Thermal Annealing (RTA) at 500° C. for one minute in air atmosphere to manufacture the P-type electrode structure using Ohmic contact.

Figure 2:
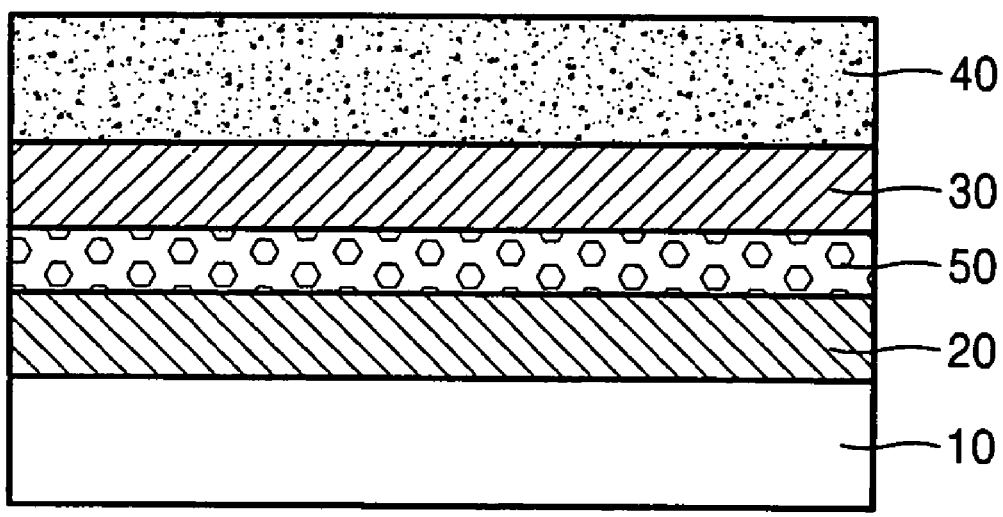
FIG. 2 is a sectional view illustrating a P-type electrode structure according to another embodiment of the present invention.

FIG. 2 is a sectional view illustrating a P-type electrode structure according to another embodiment of the present invention.

Elements having the same functions as those of FIG. 1 are denoted using the same reference numerals.

Referring to FIG. 2, a first metal layer 50, a second metal layer 30 and a reflective layer 40 are sequentially formed on a P-type clad layer 20 formed on a substrate 10.

As described above, also in FIG. 2, the P-type electrode structure includes a III-group nitride-based P-type clad layer 20 that is formed on a sapphire substrate 10; and the first metal layer 50, the second metal layer 30 and the reflective layer 40 that are sequentially layered on the P-type clad layer 20. A characteristic experiment is made between the P-type clad layer 20 and the P-type electrode structure.

The first metal layer 50 may be formed of any one selected from the above-described second metal group, that is, the group consisting of Nickel (Ni), Cobalt (Co), Copper (Cu), Palladium (Pd), Platinum (Pt), Ruthenium (Ru), Rhodium (Rh), Iridium (Ir), Tantalium (Ta), Rhenium (Re), Tungsten (W), and Lanthanum (La).

The second metal layer 30 is formed of the same material as that of the metal layer 30 described through FIG. 1.

That is, the second metal layer 30 is formed of any one selected from the first metal group including Zinc (Zn), Indium (In) and Tin (Sn).

Otherwise, the second metal layer 30 can be formed of any one main ingredient selected from the first metal group and any one additional ingredient selected from the above-described second metal group.

The first metal layer 50, the second metal layer 30 and the reflective layer 40 have a total thickness of about 0.1 nm to 10 µm.

The above P-type electrode structure performs a deposition process and an annealing process, as described above.

Hereinafter, an experimental result for the above-described P-type electrode structure that is formed on the P-type clad layer 20 having the gallium nitride (GaN) as the main ingredient is described with reference to FIGS. 3 through 5.

Figure 3:
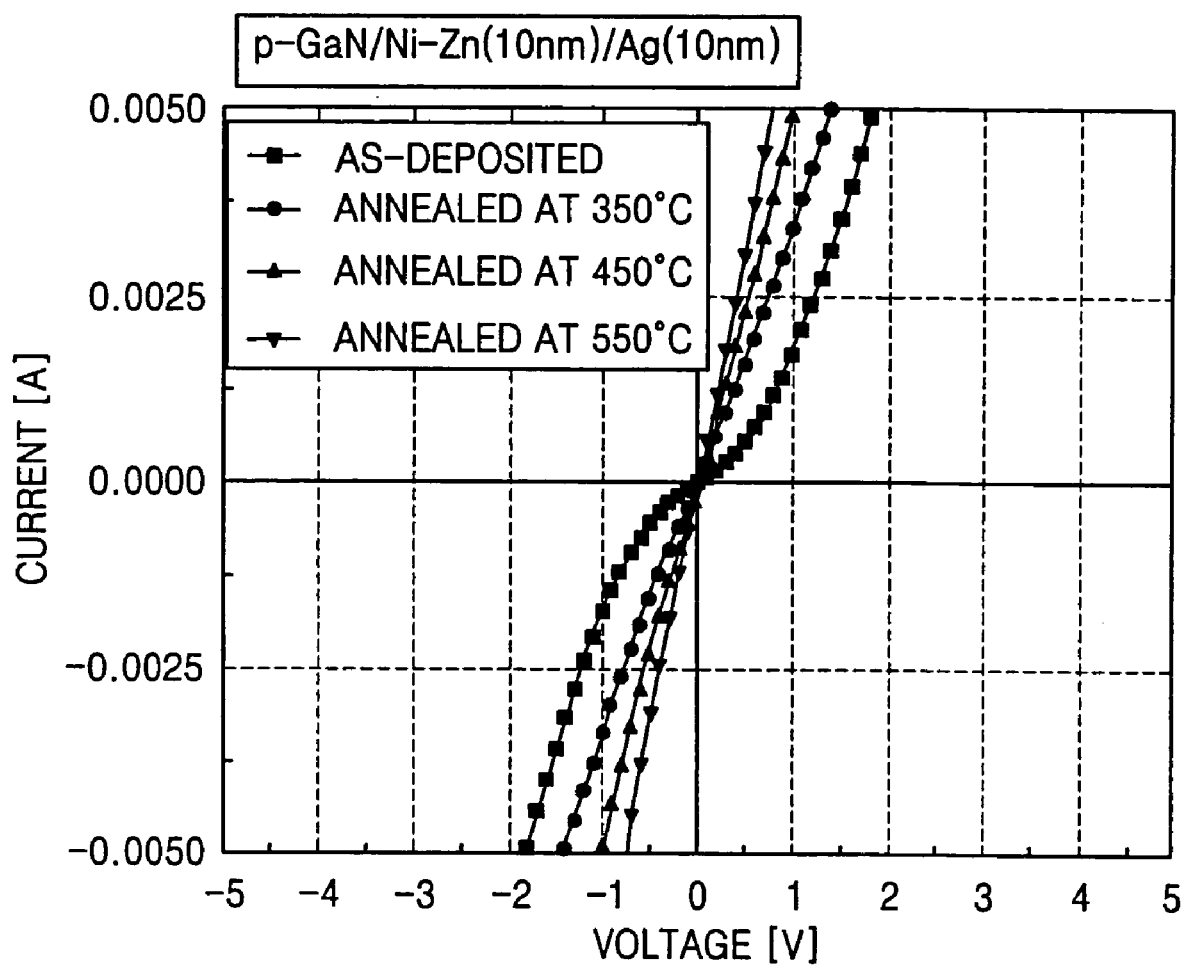
FIGS. 3 through 5 are graphs illustrating current-voltage characteristics measured before and after a P-type electrode structure of FIG. 1 is annealed.
Figure 4:
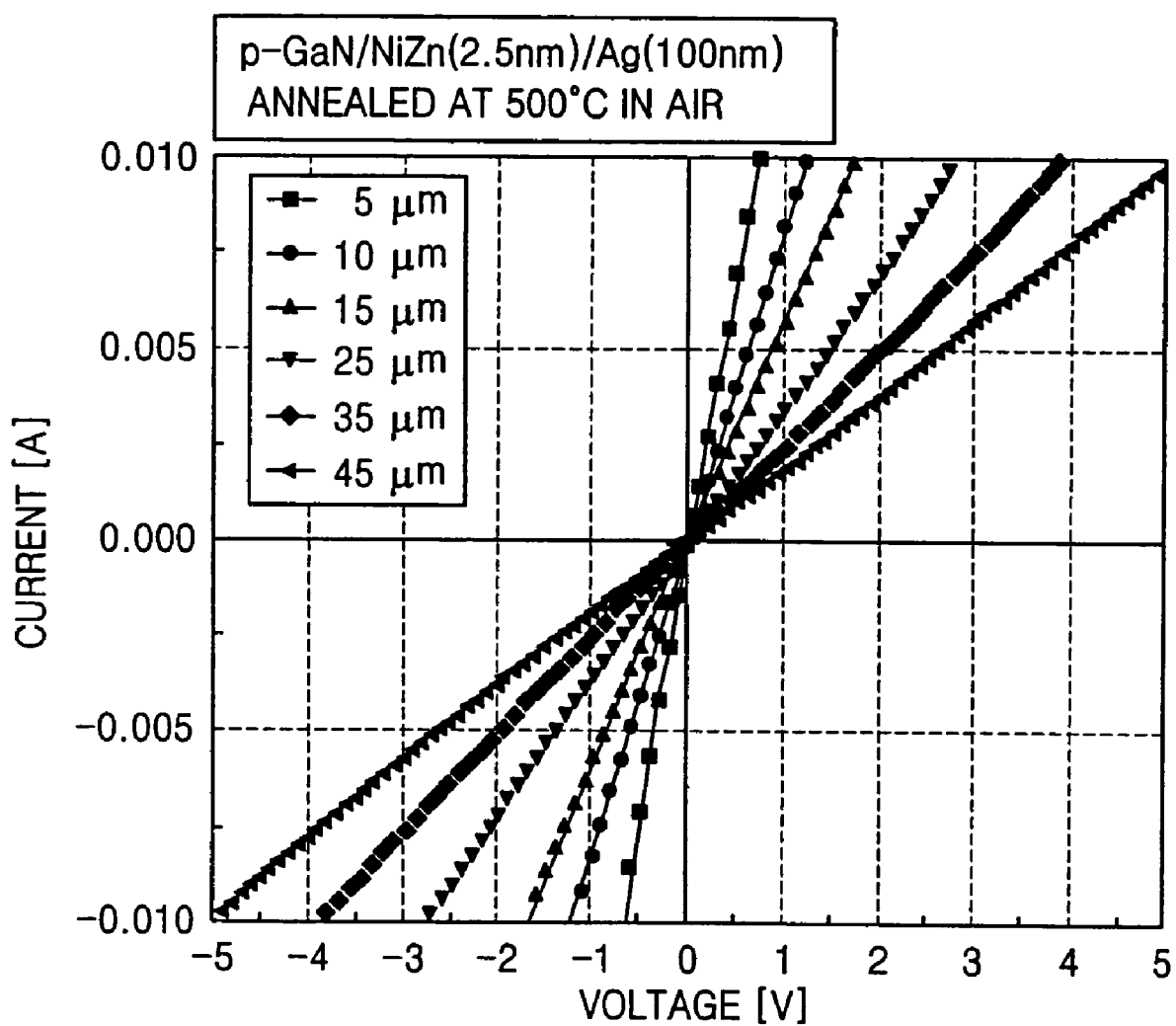
Figure 5:
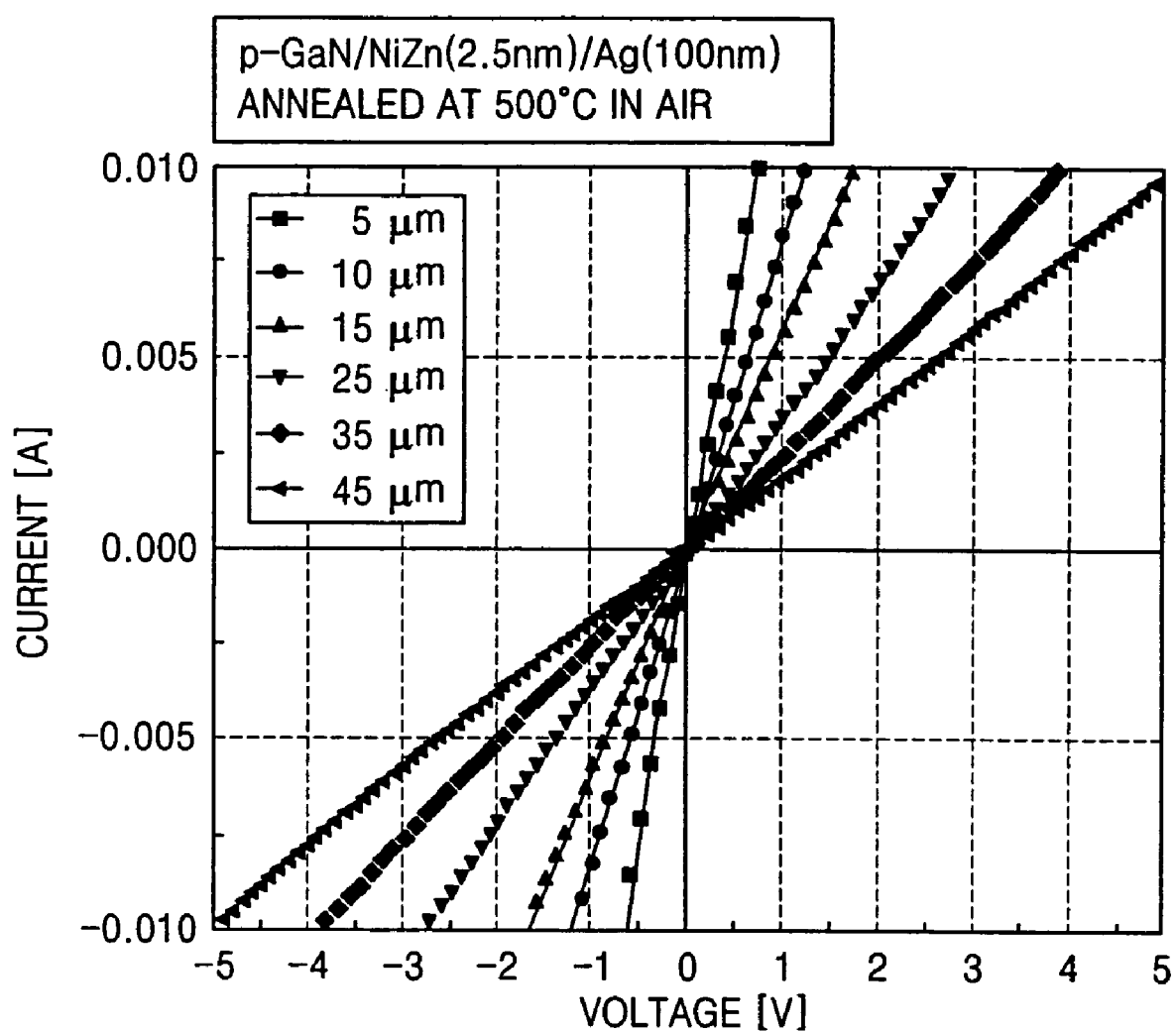

FIGS. 3 through 5 are graphs illustrating measurement results of electrical characteristics before and after the P-type electrode structure is annealed in air atmosphere.

In the P-type electrode structure, the metal layer 30 is deposited using the zinc-nickel alloy on the P-type clad layer 20 and then, the reflective layer 40 is deposited using silver on the metal layer 30. The metal layer 30 and the reflective layer 40 are formed to have a different thickness, respectively. The P-type clad layer 20 has the main ingredient of the gallium nitride (GaN) with a carrier concentration of $4\text{-}5\times10^{17}$ cm$^{-3}$.

FIG. 3 is a measurement result of the current-voltage characteristic in the P-type electrode structure having the metal layer 30 with a thickness of 10 nm, and the reflective layer 40 with a thickness of 10 nm. FIG. 4 is a measurement result of the current-voltage characteristic in the P-type electrode structure having the metal layer 30 with a thickness of 2.5 nm, and the reflective layer 40 with a thickness of 100 nm. FIG. 5 is a measurement result of the current-voltage characteristic in the P-type electrode structure having the metal layer 30 with the thickness of 2.5 nm, and the reflective layer 40 with a thickness of 200 nm.

As appreciated from the drawings, the current-voltage characteristic after annealing is more improved than that before annealing, and the P-type electrode structure has a low relative contact resistance of $10^{-4}$ to $10^{-5}\Omega\text{cm}^2$.

Figure 6:
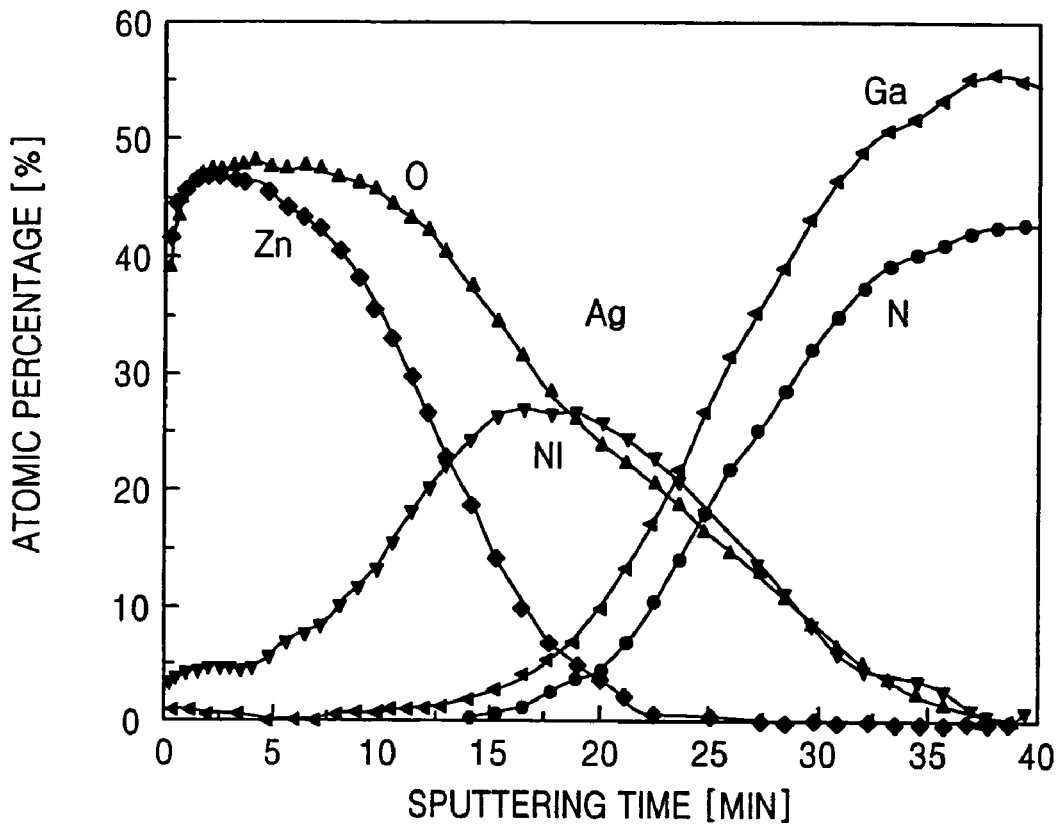
FIG. 6 is a graph illustrating an Auger depth profile after a zinc-nickel alloy/silver is deposited on a P-type clad layer, and then annealed at 500° C. for one minute in air atmosphere.

In order to analyze a cause of improving a relative contact resistance after annealing, FIG. 6 illustrates a measurement result of an Auger depth profile depending on a depth using an Auger spectroscope after the P-type electrode structure is annealed at 500° C. for one minute in air atmosphere.

In the P-type electrode structure, the metal layer 30 is deposited using the zinc-nickel alloy on the P-type clad layer 20, and the reflective layer 40 is deposited using silver on the metal layer 30. The metal layer 30 and the reflective layer 40 are formed to have a thickness of 10 nm, respectively.

Figure 7:
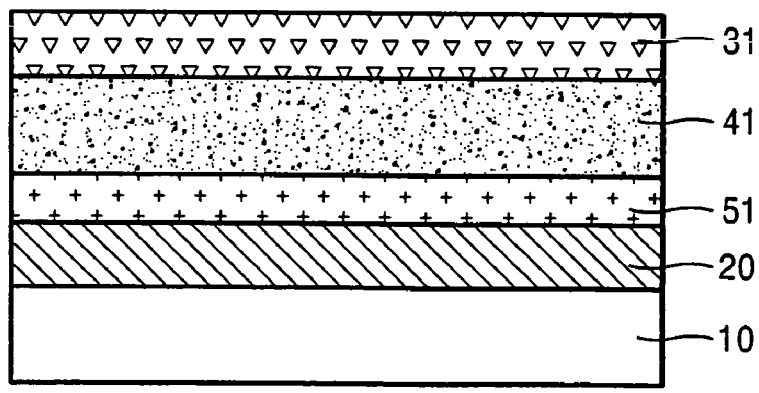
FIG. 7 is a sectional view illustrating a varied layer structure after a P-type electrode structure is annealed according to an Auger depth profile of FIG. 6.

FIG. 7 illustrates a varied layer structure after the P-type electrode structure is annealed according to the Auger depth profile of FIG. 6.

As appreciated from FIGS. 6 and 7, external oxygen is supplied through annealing, thereby causing the phase transformation from zinc to zinc oxide and from nickel to nickel oxide. Further, the nickel oxide and silver is diffused toward the P-type clad layer 20 to form a first metal oxide layer 51 that is in contact with the P-type clad layer 20.

The zinc oxide is diffused toward the uppermost layer to form a second metal oxide layer 31. A reflective layer 41 with the main ingredient being silver is located between the second metal oxide layer 31 and the first metal oxide layer 51 that contains silver.

At a room temperature, silver has —20 to 30 KJ/Kmole of enthalpy, nickel has —239 KJ/Kmole, and zinc has —350.9 KJ/Kmole. The enthalpy is energy for oxidizing metal and represents an oxidation capability. Accordingly, it can be understood that zinc and nickel are primarily oxidized at the time of annealing since they have enthalpies larger than silver by several dozens to several hundreds times.

The above result is caused when the annealing process is performed after the formation of the P-type clad layer 20, and reduces gallium oxide ($Ga_2O_3$) being a natural oxide that remains on a surface of the P-type clad layer 20 while functioning as an obstacle of carrier flow at an interface between the P-type clad layer 20 and the metal layer 30 deposited thereon. Further, metal used as the metal layer 30 is oxidized to be phase-transformed into a transparent conductive or semi-transparent conductive oxide. Accordingly, transparent conductive or semi-transparent conductive metal oxide layers 31 and 51 are formed, thereby reducing Schottky barrier height and width.

Besides, tunneling conduction is generated at the interface between the P-type clad layer 20 and the P-type electrode structure by the gallium vacancy formed on the surface of the P-type clad layer 20, the reduction of the natural oxide, and the formation of the transparent conductive metal oxide layers 31 and 51.

As a result, the P-type clad layer 20 functions as the dopant such that an effective hole concentration can be increased in the vicinity of the surface of the P-type clad layer 20.

Further, since the zinc oxide (ZnO) formed at the time of annealing in air or oxygen atmosphere and a zinc-based or magnesium-based alloy or the metal selected from the second metal group have almost the same work function as gallium nitride, the Schottky barrier height is reduced when they are in contact with the P-type clad layer 20, thereby improving an Ohmic contact characteristic and providing transmission of almost 100%.

Furthermore, the second metal oxide layer 31 being the natural oxide is formed on the surface of the uppermost layer, and the first metal oxide layer 51 being in contact with the P-type clad layer 20 is formed of the second metal group oxide (for example, Ni—O, Co—O and the like) containing silver, thereby reducing the Schottky barrier height. The reduced Schottky barrier height allows a high quality of Ohmic contact. At this time, a thick silver (Ag) layer 41 is interposed between the second metal oxide layer 31 being the zinc oxide layer and the first metal oxide layer 51 being the internally diffused second metal group oxide, thereby contributing to the conductivity improvement of nickel and functioning as an excellent reflective layer in flip-chip light emitting devices (FCLEDs).

Figure 8:
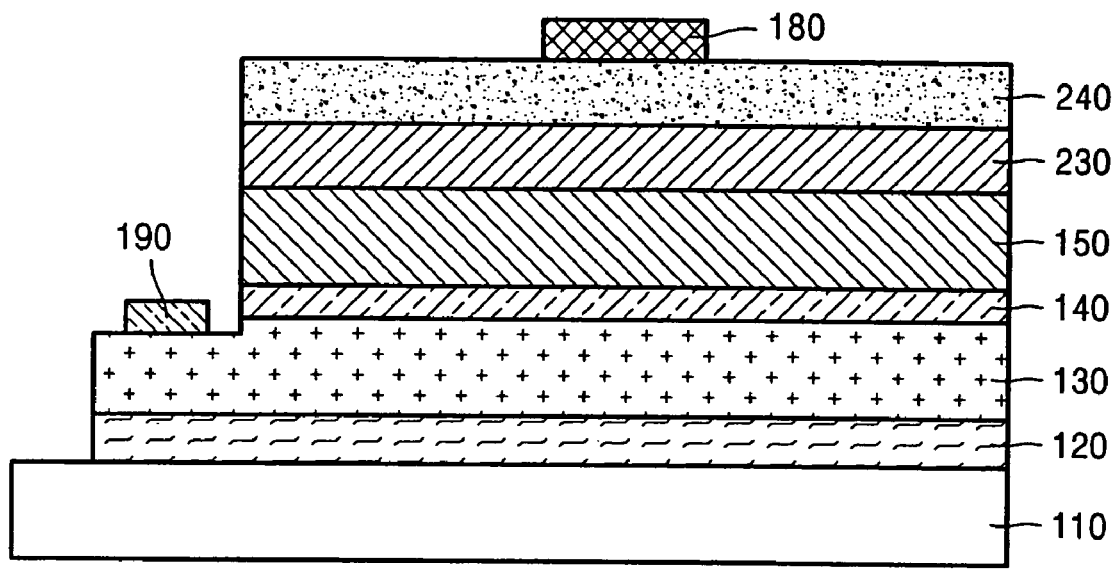
FIG. 8 is a sectional view illustrating a light emitting device employing a P-type electrode structure according to an embodiment of the present invention.

FIG. 8 is a sectional view illustrating the light emitting device employing the P-type electrode structure of FIG. 1 according to an embodiment of the present invention.

Referring to FIG. 8, the light emitting device includes a substrate 110, a buffer layer 120, an N-type clad layer 130, a light emitting layer 140, a P-type clad layer 150, a metal layer 230 and a reflective layer 240 that are sequentially layered.

Reference numeral 180 refers to a P-type electrode pad, and reference numeral 190 refers to a N-type electrode pad.

The substrate 110 is formed of sapphire or silicon carbide (SiC).

The buffer 120 can be omitted.

Each layer between the buffer layer 120 to the P-type clad layer 150 is based on any compound selected from compounds expressed in the general formula $Al_xIn_yGa_zN$ ($0 \leq x \leq 1$, $0 \leq y \leq 1$, $0 \leq z \leq 1$, $0 \leq x+y+z \leq 1$) of the III-group n compound, and the N-type clad layer and the P-type clad layer have corresponding dopants added thereto.

Further, the light emitting layer 140 can be constructed such as a single layer or a Multiple-Quantum Well (MQW) layer in the various well-known methods.

As one example, the buffer layer 120 is formed of GaN, the N-type clad layer 130 is formed with N-type dopants such as Si, Ge, Se, Te being added to GaN, and the P-type clad layer 150 is formed with P-type dopants such as Mg, Zn, Ca, Sr, Ba being added to GaN.

The layers are respectively formed using various well-known deposition methods, for example, PVD, CVD, PLD, dual-type thermal evaporator, and sputtering.

The electrode layer 230 is formed of the first metal group or the alloy having the second metal group added to the first metal group that are described above through FIG. 1, and the reflective layer 240 is formed of silver or rhodium and then annealed.

Figure 9:
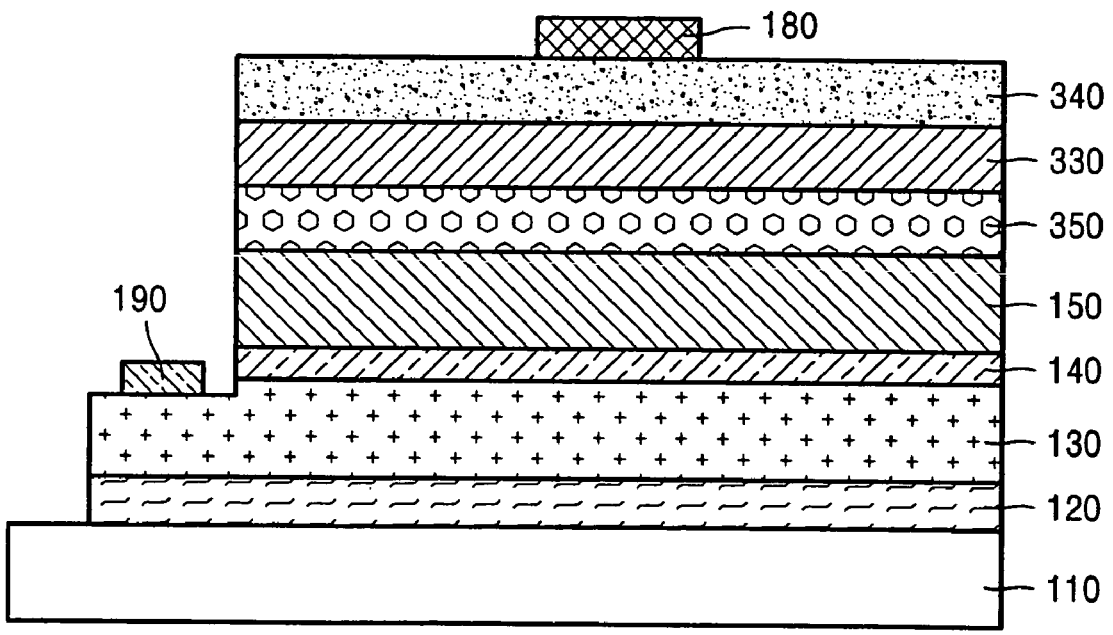
FIG. 9 is a sectional view illustrating a light emitting device employing a P-type electrode structure according to another embodiment of the present invention.

FIG. 9 is a sectional view illustrating a light emitting device employing a P-type electrode structure according to another embodiment of the present invention.

Elements having the same functions are denoted by the same reference numerals.

Referring to FIG. 9, the light emitting device includes a substrate 110, a buffer layer 120, an N-type clad layer 130, a light emitting layer 140, a P-type clad layer 150, a first metal layer 350, a second metal layer 330, and a reflective layer 340.

The first metal layer 350 is formed of any one of the second metal group that is described above in FIG. 2.

The second metal layer 330 is formed of the first metal group or the second metal group added to the first metal group that are described above through FIG. 1.

The reflective layer 340 is formed of silver or rhodium.

Figure 10:
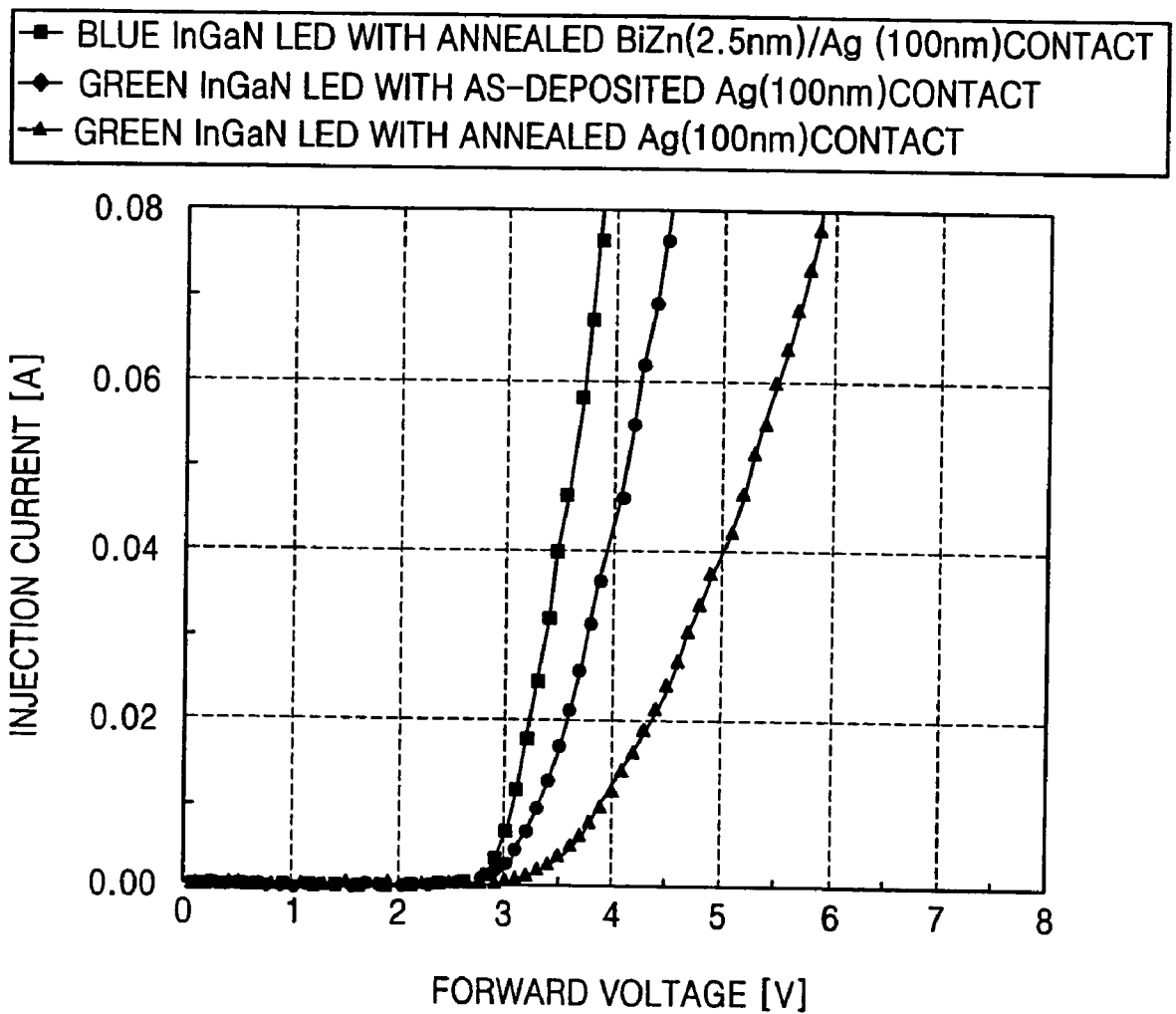
FIG. 10 is a graph illustrating the comparative result of current-voltage characteristics of light emitting devices with a zinc-nickel alloy/silver deposited and annealed in air atmosphere and with only silver deposited and annealed in air atmosphere.

FIG. 10 is a graph illustrating the comparative result of current-voltage characteristics of light emitting devices having the zinc-nickel alloy/silver deposited and annealed in the air atmosphere, and having only silver deposited and annealed in the air atmosphere.

As appreciated in FIG. 10, the light emitting device employing the above P-type electrode structure according to the present invention has an excellently improved electrical characteristic.

That is, a blue-light emitting diode with an InGaN structure has the metal layer 230 formed of the zinc-nickel alloy to have the thickness of 2.5 nm and the reflective layer 240 formed of silver to have the thickness of 100 nm. The above blue-light emitting diode has an operation voltage of 3.25V at 20 mA. However, a blue-light emitting device having the reflective layer 240 formed of only silver at the thickness of 100 nm has an operation voltage larger than the 3.25V.

Especially, the light emitting device having only silver deposited to have the thickness of 100 nm and then, annealed in the air atmosphere has the operation voltage greatly larger than before annealing, and has a considerable electrical degradation.

Hereinafter, the present invention describes, but is not limited to, an example of manufacturing the light emitting device.

First, a surface treatment and a electron beam lithography for the P-type clad layer 150 are applied, in the same manner as the aforementioned embodiment, to the light emitting structure with the substrate, the buffer layer, the N-type clad layer, the light emitting layer and the P-type clad layer that have GaN as the main ingredient, excepting for the P-type electrode structure not yet deposited.

After the surface treatment and the electron beam lithography, the metal layer 230 is formed of the zinc-nickel alloy to have the thickness of 2.5 nm, and then silver is deposited on the resultant to have the thickness of 100 nm. After that, the resultants is processed by the lift-off process using acetone, and then is annealed at 500° C. for one minute in the air atmosphere in a rapid thermal annealing furnace. As a result, the light emitting diode is manufactured using the Ohmic contact.

As described above, the nitride-based light emitting device and the manufacture method thereof according to the present invention provide an advantage in that the Ohmic contact characteristic with the P-type clad layer is improved to thereby enhance a wire bonding efficiency and a yield when the light emitting device is packaged, and the low relative contact resistance and the excellent current-voltage characteristic can improve a light emitting efficiency and a device life.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nitride-based light emitting device having a light emitting layer between an N-type clad layer and a P-type clad layer, the light emitting device comprising:
    a reflective layer formed of rhodium which reflects light emitting from the light emitting layer;
    at least one metal layer which is formed between the reflective layer and the P-type clad layer, wherein the at least one metal layer comprises any one of selected from a first metal group consisting of zinc, indium and tin; and
    a P-type electrode pad formed on a portion of the reflective layer,
    wherein the P-type electrode pad covers a portion, less than a whole, of an upper surface of the reflective layer.

2. The light emitting device of claim 1, wherein the at least one metal layer includes the addition of any one of selected from a second metal group consisting of nickel, cobalt, copper, palladium, platinum, ruthenium, rhodium, iridium, tantalum, rhenium, tungsten and a lanthanum-based metal, to any one selected from the first metal group.

3. The light emitting device of claim 2, wherein an addition ratio of the second metal group to the first metal group is 0.1 to 51 atomic percentages.

4. The light emitting device of claim 1, wherein the at least one metal layer comprises:
    a first metal layer formed on the P-type clad layer; and
    a second metal layer formed between the first metal layer and the reflective layer,
    the first metal layer is formed of any one of selected from a second metal group consisting of nickel, cobalt, copper, palladium, platinum, ruthenium, rhodium, iridium, tantalum, rhenium, tungsten, and a lanthanum-based metal, and
    the second metal layer is formed of any one of selected from the first metal group consisting of zinc, indium and tin.

5. The light emitting device of claim 4, wherein the second metal layer is formed by addition of any one selected from the second metal group to any one selected from the first metal group.

6. The light emitting device of claim 1, wherein the at least one metal layer and the reflective layer have a thickness of 0.1 nm to 10 μm.

7. The light emitting device of claim 1, wherein the N-type clad layer is formed on a substrate that is formed of light transmission material.

8. The light emitting device of claim 7, wherein the substrate is formed of sapphire.

9. A nitride-based light emitting device having a light emitting layer between an N-type clad layer and a P-type clad layer, the light emitting device comprising:
    a metal layer formed directly on the P-type clad layer;
    a reflective layer formed directly on the metal layer which reflects light emitting from the light emitting layer,
    wherein the metal layer reacts with a component of the P-type clad layer other than nitride to increase an effective carrier concentration of the P-type clad layer; and
    a P-type electrode pad formed on a portion of the reflective layer, wherein the P-type electrode pad covers a portion, less than a whole, of an upper surface of the reflective layer.

10. The light emitting device of claim 9, wherein the metal layer is selected from the group consisting of nickel, palladium, platinum, tungsten, indium, tin, cobalt, copper, ruthenium, rhodium, iridium, tantalum, rhenium, and a lanthanum-based metal.

11. The light emitting device of claim 9, wherein the metal layer comprises:
    a first metal layer formed directly on the P-type clad layer, the first metal layer selected from the group consisting of zinc, indium and tin; and
    a second metal layer formed directly on the first metal layer, with the reflective layer formed directly on the second metal layer, the second metal layer selected from the group consisting of nickel, palladium, platinum, tungsten, cobalt, copper, ruthenium, rhodium, iridium, tantalum, rhenium, and a lanthanum-based metal.

12. The light emitting device of claim 9, wherein the metal layer covers substantially all of an upper surface of the P-type clad layer.

* * * * *